United States Patent
Hunt et al.

Patent Number: 5,117,555
Date of Patent: Jun. 2, 1992

[54] MODULAR SYSTEM AND METHOD FOR POPULATING CIRCUIT BOARDS

[75] Inventors: Ronald E. Hunt, Georgetown; Verlon E. Whitehead, Austin, both of Tex.

[73] Assignee: International Business Machines Corporation, Armonk, N.Y.

[21] Appl. No.: 642,616

[22] Filed: Jan. 17, 1991

[51] Int. Cl.$^5$ .......................... H05K 3/34; B23P 19/00
[52] U.S. Cl. ........................ 29/840; 29/740; 414/225
[58] Field of Search .......... 29/740, 840, 739; 414/225

[56] References Cited

U.S. PATENT DOCUMENTS

| | | | |
|---|---|---|---|
| 4,292,116 | 9/1981 | Takahashi et al. | 29/740 X |
| 4,345,371 | 8/1982 | Ohsawa et al. | 29/740 X |
| 4,375,126 | 3/1983 | Düll et al. | 29/740 |
| 4,386,464 | 6/1983 | Yanai et al. | 29/740 X |
| 4,452,557 | 6/1984 | Bouwknegt et al. | 29/740 X |
| 4,868,979 | 9/1989 | Fukushima et al. | 29/740 X |
| 4,881,319 | 11/1989 | Yagi et al. | 29/740 X |

Primary Examiner—Carl J. Arbes
Attorney, Agent, or Firm—Robert M. Carwell

[57] ABSTRACT

A chip placement system of modular construction is provided for simultaneous population of circuit boards with component chips. A plurality of chip placement modules are provided, each having a conveyor means for receiving a planar from an adjacent one of the modules and transporting it through the module to a next adjacent one of the modules. Each module further includes a further plurality of chip placement subassemblies for simultaneously placing a respective plurality of chips in a preselected geometric pattern on the planar and a load plate which is slidably removable from the module which carries a plurality of stacks of chips disposed in the desired geometric pattern. The load plate of each module is periodically withdrawn in at least one of the stacks are substantially depleted, whereby a next load plate with a replenished supply of chips is slid into place. By arrangement of the conveyor system for lateral movement of the planars through each module, a plurality of such modules may be arranged side by side so as to form an assembly line, each module depositing a different geometric pattern of chips simultaneously before the planar is thence conveyed to an adjacent module. The system is reconfigurable to effect different chip placement patterns by sliding replacement subassemblies into each module or sliding additional or replacement modules into place along the line. Slideable load plate design provides for rapid replenishment of depleted chip supplies while minimizing assembly line down time.

22 Claims, 14 Drawing Sheets

MODULAR SYSTEM AND METHOD FOR POPULATING CIRCUIT BOARDS

TECHNICAL FIELD

This invention relates to systems and methods for automatically placing electronic components on circuit boards, and, more particularly, to methods and apparatus for simultaneous component placement.

BACKGROUND ART

Due to many factors including the high cost of labor associated with populating circuit boards with components, technology in the electronic manufacturing arts has developed to automatically place such components on boards. A representative sample of such systems may be seen depicted in U.S. Pat. Nos. 4,202,092, 4,543,713, 4,222,166, 4,528,747, 4,300,715, and 4,451,324.

In a move to simplify the simultaneous positioning of chips adjacent correlative sites of a circuit board, a system was provided by Panasonic National, details of a representative system thereof being set forth in a publication entitled "Specifications: Panasert Simultaneous Chip Component Placement Machine Model NM-8270". With regard to such disclosure and specifically with respect to the details thereof set forth on page 8, a plurality of tubes, each carrying stacked components therein may be loaded directly onto corresponding placement stations within the machine. The circuit board to be populated is thence positioned over the plurality of component tubes. The tubes are arranged in a horizontal pattern corresponding to the horizontal pattern of sites on the underneath side of the board at which the components are desirably to be placed. The underneath site of the board is coated with an adhesive. Upon urging of the stacks of components within their corresponding tubes by means of pushpins or the like, the topmost components of the tubes are thereby urged against the adhesive on underneath side of the board at the corresponding location thereon where the components are desired to be placed. The thus-populated board is then replaced with the next board and the process repeated, resulting in simultaneous multiple chip component placement.

While the aforementioned system does eliminate problems associated with the other hereinbefore cited references including the complexity of robotic arms, relative complex travel paths of the circuit components from magazines or tapes to the circuit board sites, and the like, several serious problems are nevertheless associated with this system. Notable among these are the tendency which components have to stick together when withdrawn vertically from the stacks caused by static, dust, dirt, adhesive, or other particulate matters present on the components and adjacent thereto. Problems associated with this failure of components to uniformly exit the tube and be deposited on the board include jamming of the system and incorrect orientation of the uppermost chips in the tube after deposition on the underneath side of the board in undesired orientations. This, in turn, results in unacceptable rejection rates for the populated boards.

In an effort to alleviate these problems, in our co-pending U.S. Patent application Ser. No. 07/353,299, which is a Continuation-in-Part of Ser. No. 07/155,945, now abandoned, incorporated herein by reference, a system was disclosed for simultaneously dispensing a plurality of chips from corresponding vertical stacks arranged in a load plate for subsequent downward displacement onto the upper surface of a planar board in a desired pattern.

In such a system, each component was individually stripped from the bottom portion of its corresponding stack of components prior to further displacement downward. In this manner, the aforementioned problem was alleviated of components sticking together when displaced upwards and fixed to the underneath side of a board. However, several additional problems remain with the hereinbefore noted Panasonic system which have been addressed by the present invention.

First, the prior art system has provided a relatively large and complex machine which was, for all practical purposes, dedicated to one pattern of chips and a relatively small chip density or population due to the bulk of the apparatus required for positioning each of a plurality of columns of chips in the desired location in the plane for placement. Changing the pattern and type of chips was an extremely cumbersome and time consuming process requiring large amounts of down time of the expensive machine while it was being reconfigured to a new chip pattern. Moreover, it was still often extremely difficult to accurately align and position chips for placement on the planars. This was due to the extremely minute dimensions of the chips and extreme accuracy required in their placement on the planars in order to properly align with the circuit traces disposed thereon.

Accordingly, a chip placement system was desired for simultaneous multiple component placement which was of a small, simple, inexpensive, and reliable construction for populating high circuit density boards. Such apparatus was further desired which facilitated off-line modification of the chip placement patterns and replenishment of chip supplies to accommodate different product circuit boards and to minimize placement machine down time. Moreover, a modular system was further desired which could readily provide for a multiplicity of such machines arranged in tandem and ready substitution of machines in the system. This would facilitate higher density population of boards wherein due to limited area above a board, mechanisms could not be devised small enough and yet reliable to simultaneously place all such chips in one operation or machine.

SUMMARY OF THE INVENTION

A chip placement system of modular construction is provided for simultaneous population of circuit boards with component chips. In a preferred embodiment, a plurality of chip placement modules are provided. Each module has a conveyor means for receiving a planar from an adjacent one of the modules and transporting it through the module to a next adjacent one of the modules. Each module further includes a plurality of chip placement subassemblies for simultaneously placing a respective plurality of chips in a preselected geometric pattern on the planar. Each module further includes a load plate which is slidably removable from the module which carries a plurality of stacks of chips disposed in the desired geometric pattern. The load plate of each module is periodically withdrawn in at least one of the stacks are substantially depleted, whereby a next load plate with a replenished supply of chips is slid into place. In the preferred embodiment, each module is further provided with a shuttle plate assembly for simultaneously stripping a plurality of chips each from a respective one of the stacks on the load plate and a vacuum plate assembly for simultaneous periodic support of the stripped chips and subsequent urging thereof into disposition on the planar surface. A lift plate assembly is further provided in each module for urging the planar, once it enters the module by the conveyor, into contact with the shuttle plate assembly. A system is further provided in each module for automatically registering vertically the vacuum plate, planar, and shuttle plate assembly during the act of urging of these various assemblies towards one another so as to ensure accurate placement in the horizontal plane of the chips as desired. By arrangement of the conveyor system for lateral movement of the planars through each module, a plurality of such modules may be arranged side by side so as to form an assembly line each module depositing a different geometric pattern of chips simultaneously before the planar is thence conveyed to an adjacent module. The system accordingly provides for rapid, cost effective reconfiguration to effect different chip placement patterns by sliding replacement subassemblies into each module or sliding additional or replacement modules into place along the line. Slideable load plate design provides for rapid replenishment of depleted chip supplies while minimizing assembly line down time.

DESCRIPTION OF THE PREFERRED EMBODIMENT

Figure 1:
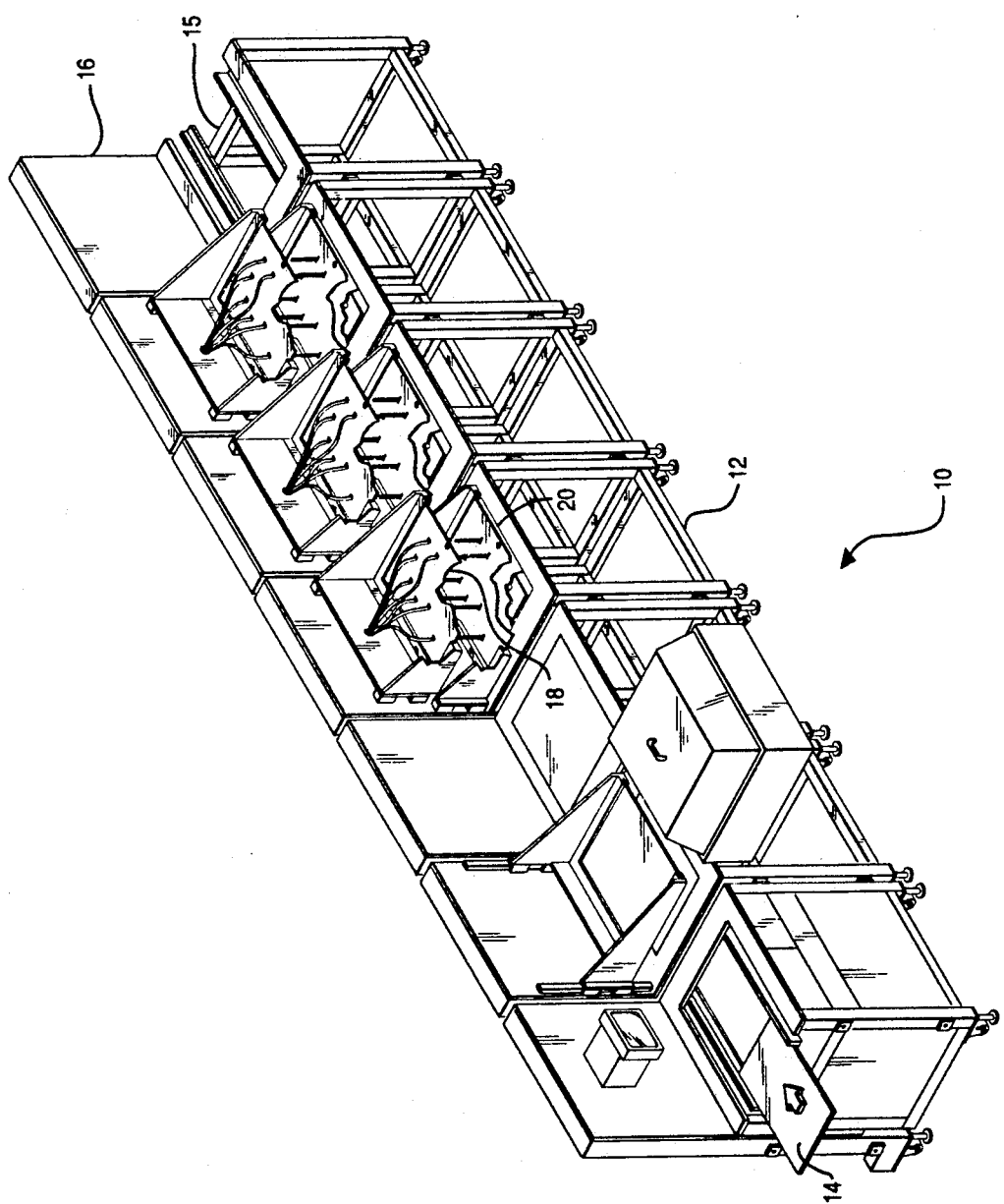
FIG. 1 is a pictorial illustration of the modular component placement system of the invention.

In FIG. 1, the placement system 10 of the invention is shown being comprised of a plurality of modules 12 aligned side by side. Each module will contain apparatus for placing a plurality of chips on a printed circuit board 14. It is a feature of the invention that each such module is designed in a self-contained manner to be described. It may place components of a selection and pattern unique to the particular module whereupon the board 14 is thence passed to an adjacent such module 12 for placement of a next plurality of components whose composition and geometrical arrangement is again fashioned in a manner controlled by that particular module. Each of the modules 12 includes a conveyor system whereby upon introduction of a bare board 14 into the conveyor system as shown in FIG. 1, the board is transported laterally through successive such modules 12 being increasingly populated with components by each module 12 until it exits the system 10 at the last module at the location 15.

It is yet an additional feature of the invention that each module 12 is designed whereby it may be custom configured to place a plurality of components in a desired geometric pattern different from that of the adjacent modules dictated by the arrangement of chip placement apparatus on the various plates associated with each module 12. In this manner, not only may a chip supply be replenished by replacing the load plate associated with each module 12 in a manner to be described, but the constitution and geometrical arrangement of the chips in a given module 12 may be adapted in a desired manner by modifying the various plates. Thus it will be seen that a great deal of flexibility is provided in the placement system 10. Individual modules 12 may be set up off line as desired for placing a desired combination of chips in a predetermined pattern. By then rolling the individual modules 12 into place to form the aggregate placement system 10, the production line may thus be modified very easily to place chips to the desired degree of density and to facilitate off line repairs to modules without shutting down the entire system simply by rolling a substitute module 12 into place.

Figure 2:
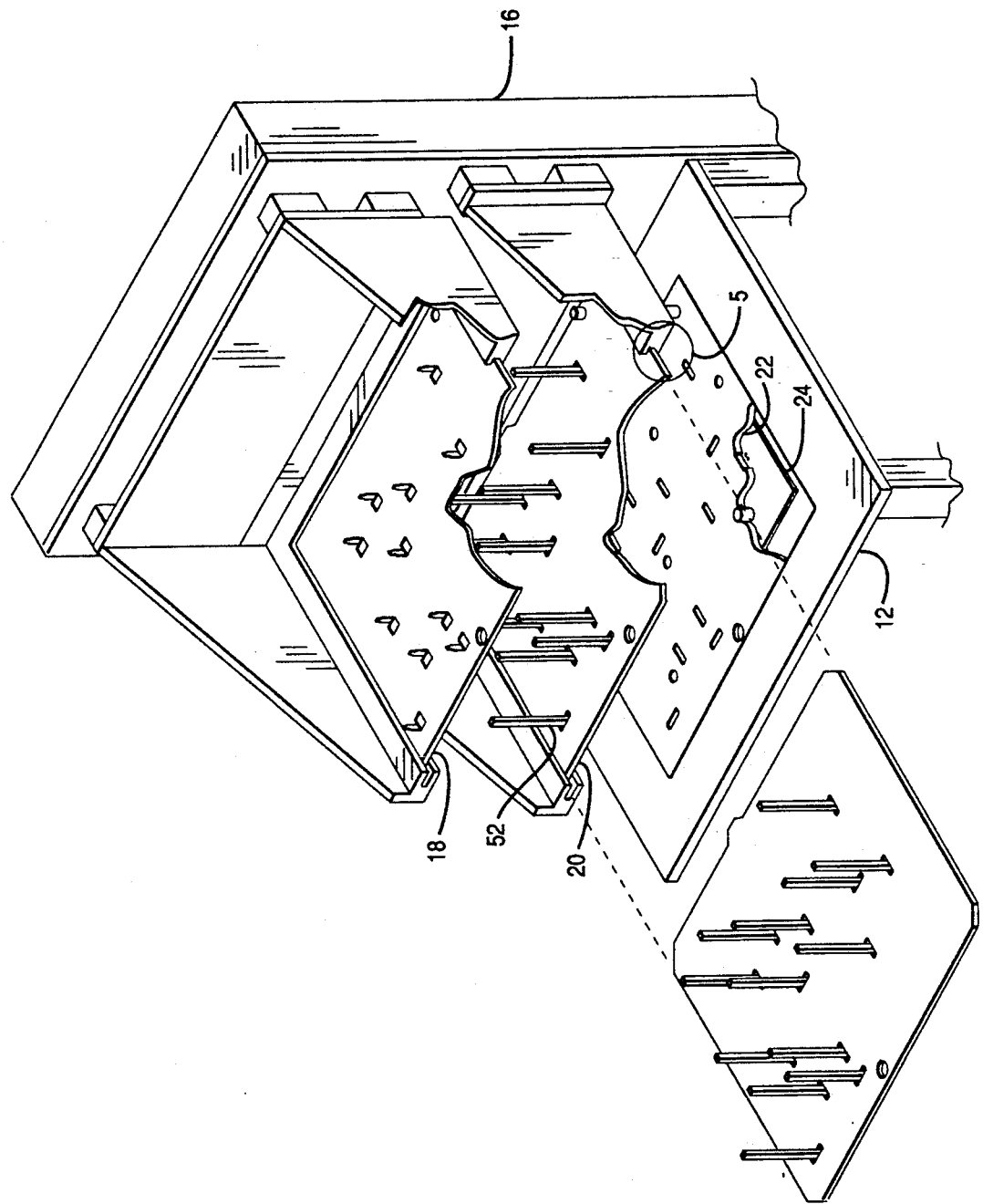
FIG. 2 is a pictorial illustration of a portion of one of the modules of FIG. 1.
Figure 5:
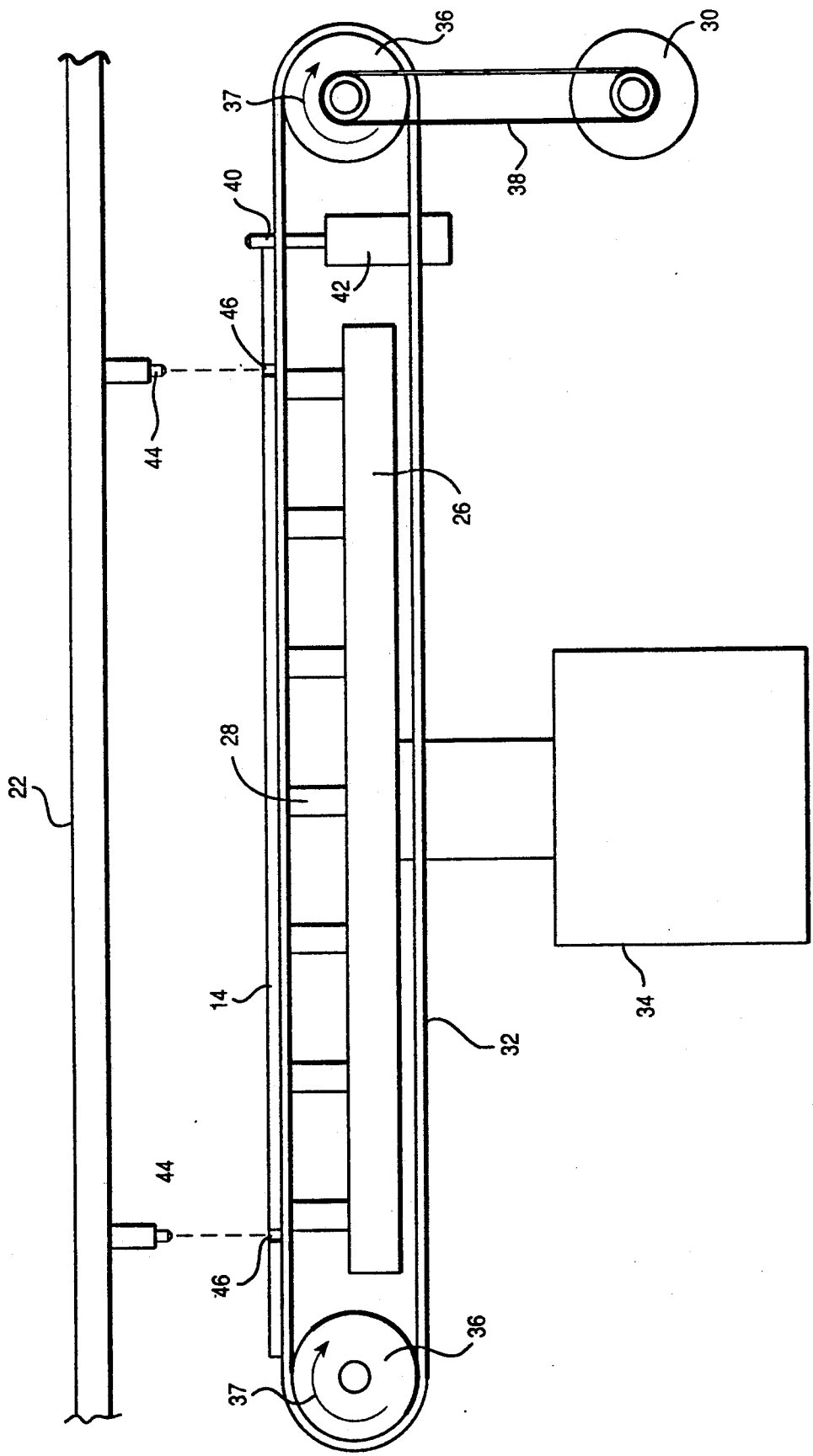
FIG. 5 is a front elevational view of one of the modules 12 of FIG. 1 depicting the conveyor and planar board support system in a first position.
Figure 6:
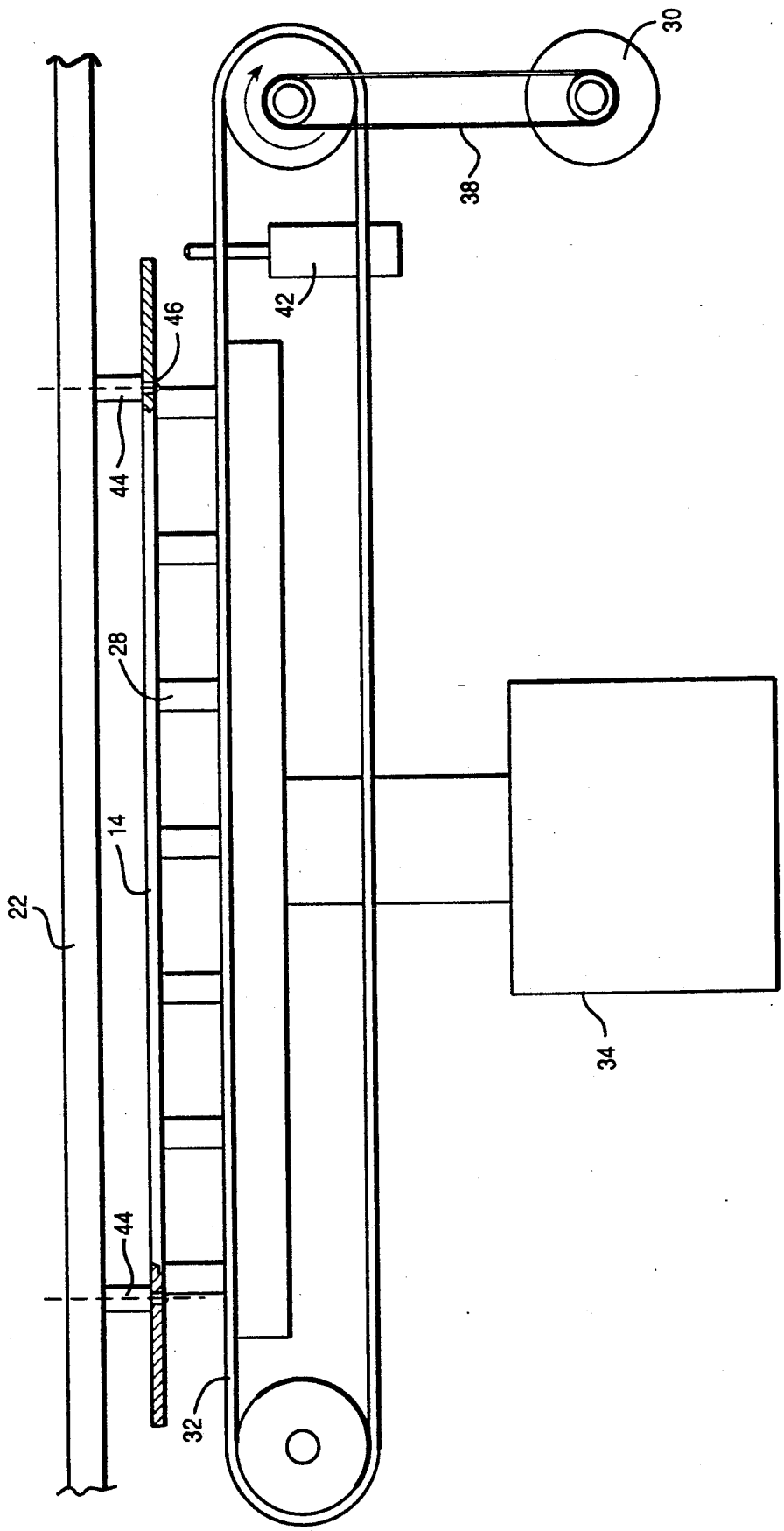
FIG. 6 is a front elevational view of the modules 12 of FIG. 1 depicting the conveyor and planar board support system in a second position.

FIG. 2 illustrates generally the makeup of the upper portion of a typical module 12 which is seen to include a frame 16 supporting a vacuum plate 18, load plates 20, stationary plate 22 and shuttle plate 24, the latter two comprising a shuttle assembly. These plate will move relative to one another in a manner to be described. Not shown in FIG. 1 but rather in FIG. 5 and 6 is yet an additional lift plate 26 disposed under the stationary plate 22, these figures depicting a frontal view of a module 22. This lift plate includes standoffs 28 disposed about the surface area of the lift plate 26 in a manner so as to support the planar board 14 about its area so that it may withstand the downward force of the vacuum tube chip placement apparatus as the tubes move downward to place components on the upper surface of the board 14.

Also seen in FIG. 5 is a pneumatically actuated cylinder 34 which, when extended, as shown in FIG. 6, will lift the lift plate upwards so that the planar board 14, carried on the upper portions of the standoffs 28 of the lift plate 26 will be caused to engage components of the stationary plate 22. More particularly, registration pins 44 which are pendently disposed downwards from the stationary plate 22 will engage mating board registration holes 46 disposed through the supported planar board 14 during the upward travel of the board 14 so as to cause relative positioning of the planar 14 with respect to the stationary plate 22 in the horizontal plane as desired. Upon chip placement by apparatus to be described in the module 12, the cylinder 34 will be thereafter retracted to the position shown in FIG. 5, thereby drawing the planar board 14 away from the stationary plate 22 and back onto belt 32.

FIG. 5 and 6 further disclose a conveyor motor 30 having a belt drive 38 attached to one of 2 rollers 36 which, in turn, have disposed thereabouts a planar conveyor belt 32. Actuation of the motor 30 at appropriate times will cause the rollers 36 to turn in the direction of the arrows 37 so as to transport the board 14 from left to right at desired times to be described from module to module. A solenoid 42 has extending outwards therefrom a planar stop pin 40. With the pin 40 in the position shown in FIG. 5, and with the belt 32 turning, the board 14 will be transported rightward until its right edge abuts against the stop pin 40, thereby impeding further movement of the board 46 to the right, whereupon the motor 30 is deactivated. In this manner, the board 14 will be aligned at least generally in the desired position relative to the pins 44, whereupon the previously described registration process will be more precisely align the board 14 as desired. It will be appreciated that this conveyor mechanism is replicated in each of the modules 12 whereby, as shown in FIG. 1, the board 14 may be transported laterally by each conveyor system in each module 12 to the right as the board 14 traverses the entire assembly line in the desired fashion.

Figure 3:
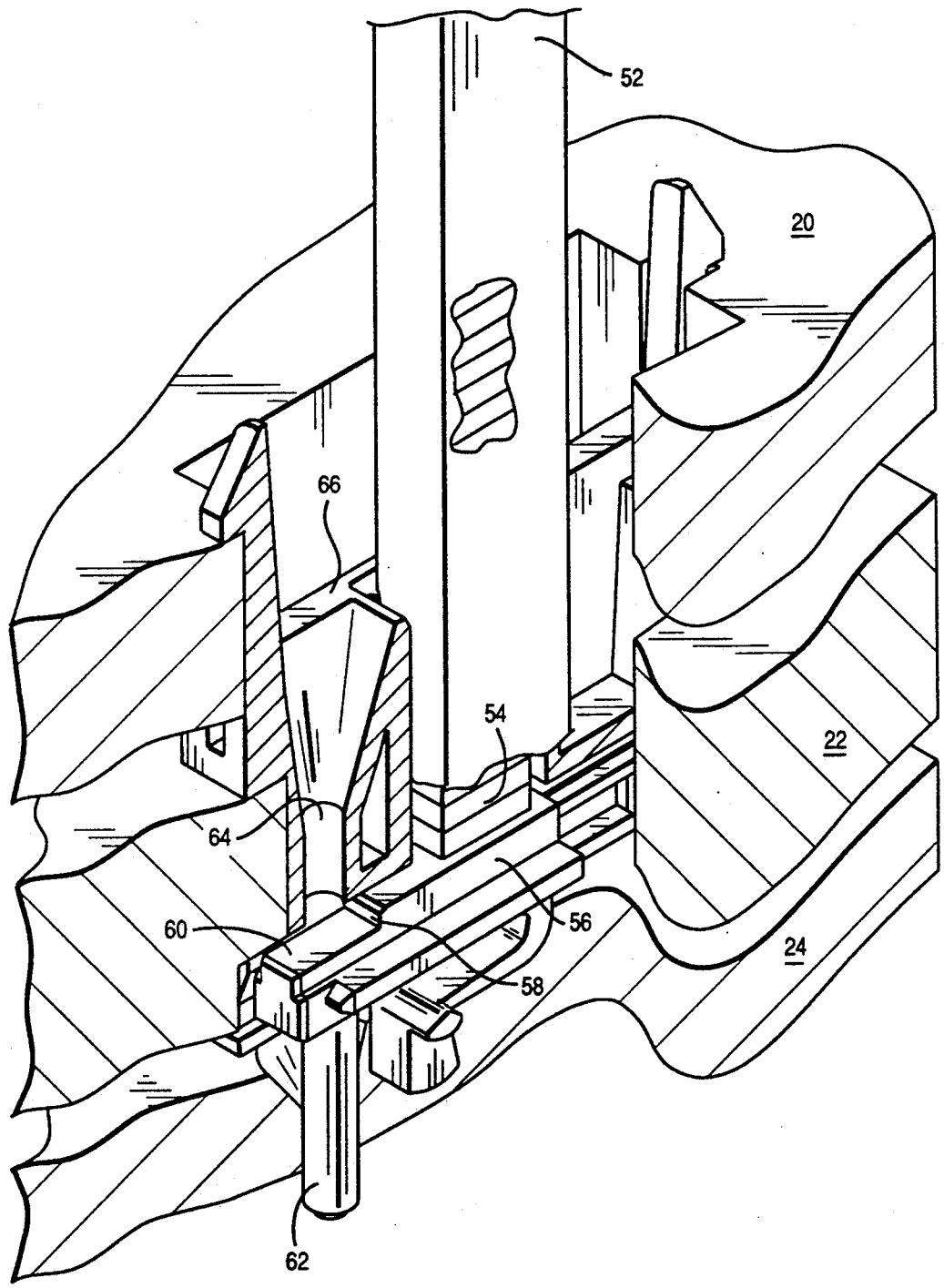
FIG. 3 is a cutaway pictorial illustration of a portion of one of the chip placement subassemblies carried by the load plate shown in FIG. 2.

Referring now to FIG. 3, a detail is shown of a component placement subassembly the structure and operation of which is described in greater detail in copending patent application Ser. No. 07/353,299 incorporated, by reference. A tube 52 contains a plurality of chips 54 stacked vertically. The chip assembly further includes a slider 56 which has a step 58 defining a chip support surface 60. The slider 56 is caused to move leftwards and rightwards by the corresponding reciprocating motion of the shuttle plate 24, inasmuch as the slider 56 includes a pin 62 extending into an aperture in the shuttle plate 24. In this manner, every time the slider 56 moves to its rightmost position, a next chip 54 is stripped off the stack of chips in the tube 52 by slider 56 and deposited on the support surface 60 of the slider 56. The chip is then transported leftwards by subsequent movement to the left of the shuttle plate 24 and slider 56. When the leftmost position of the slider 56 is reached (shown in FIG. 3 with the chip 54 removed from the support surface 60 for clarity), the chip 54 will thence be positioned in vertical registry with a funnel shaped aperture 64 extending through the block 66 of the chip placement subassembly. It will be noted that a plurality of such chip subassemblies are disposed about the load plate 20 in a desired geometric pattern corresponding to the desired location at which the plurality of chips are to be placed on the board 14.

Figure 7:
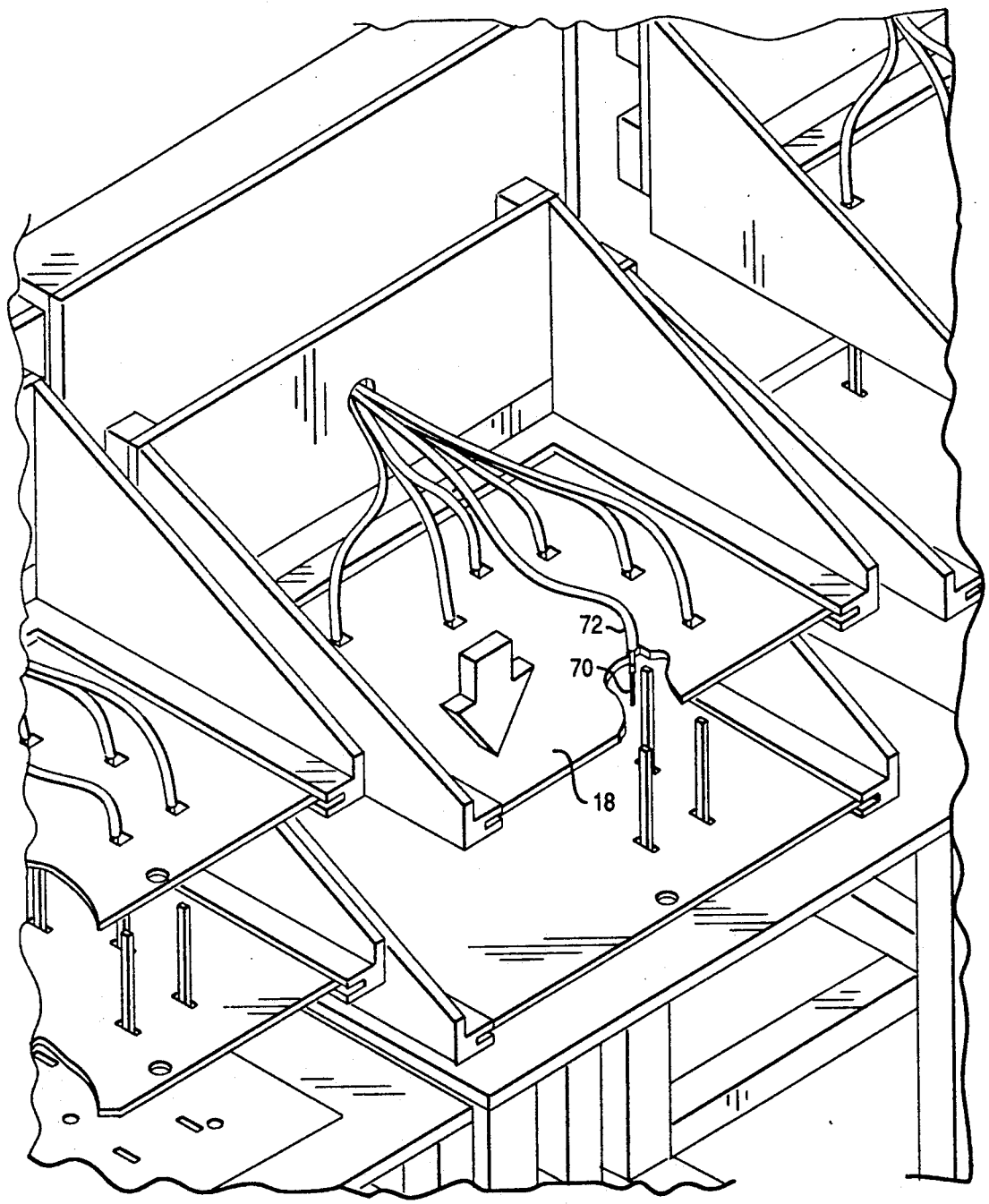
FIG. 7 is a pictorial illustration of a portion of one of the modules of FIG. 1 illustrating the vacuum plate in a first position disengaged from the load plate.
Figure 8:
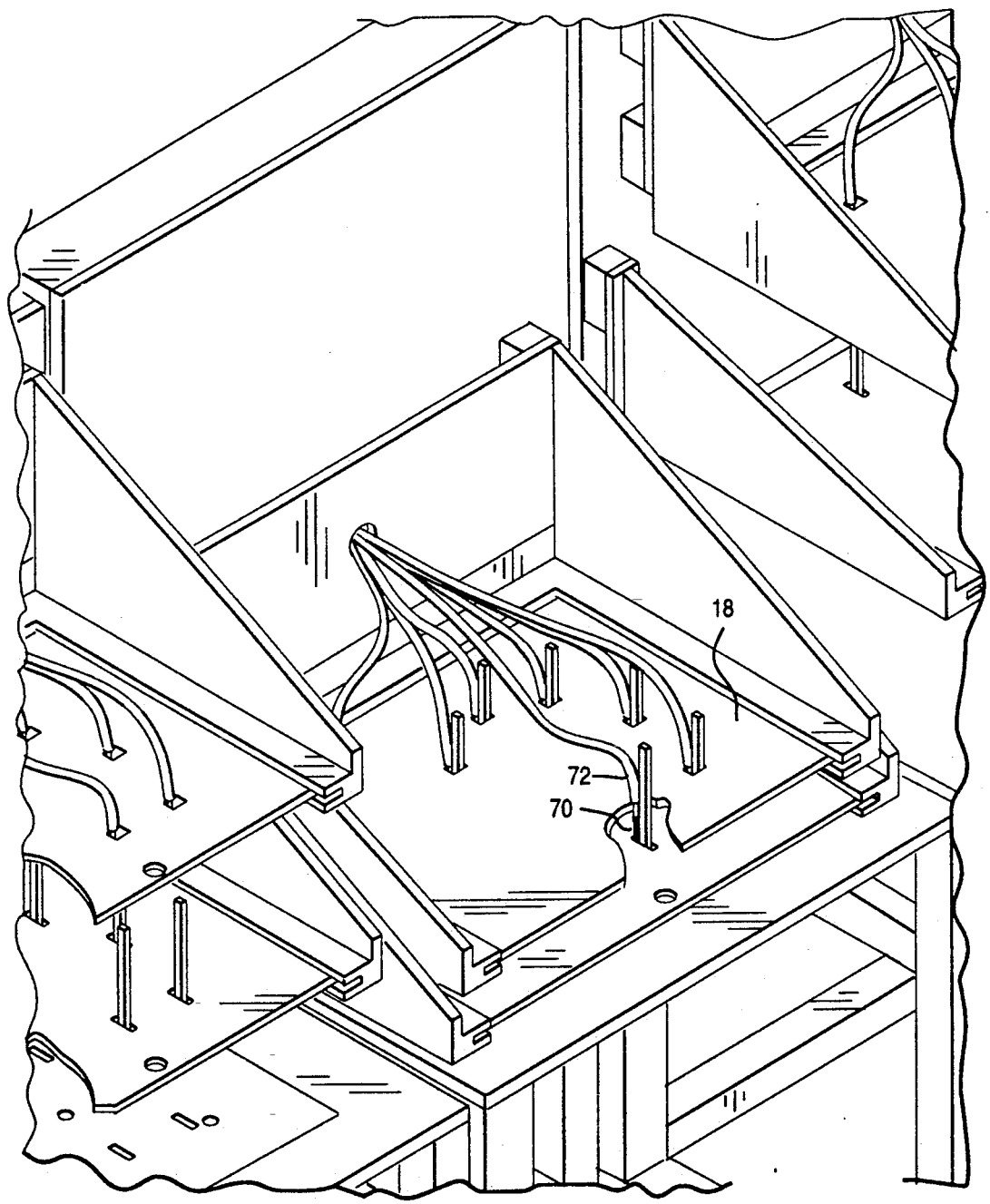
FIG. 8 is another illustration of a portion of a module of FIG. 1 showing the vacuum plate in a second position after downward movement relative to the position shown in FIG. 7
Figure 9:
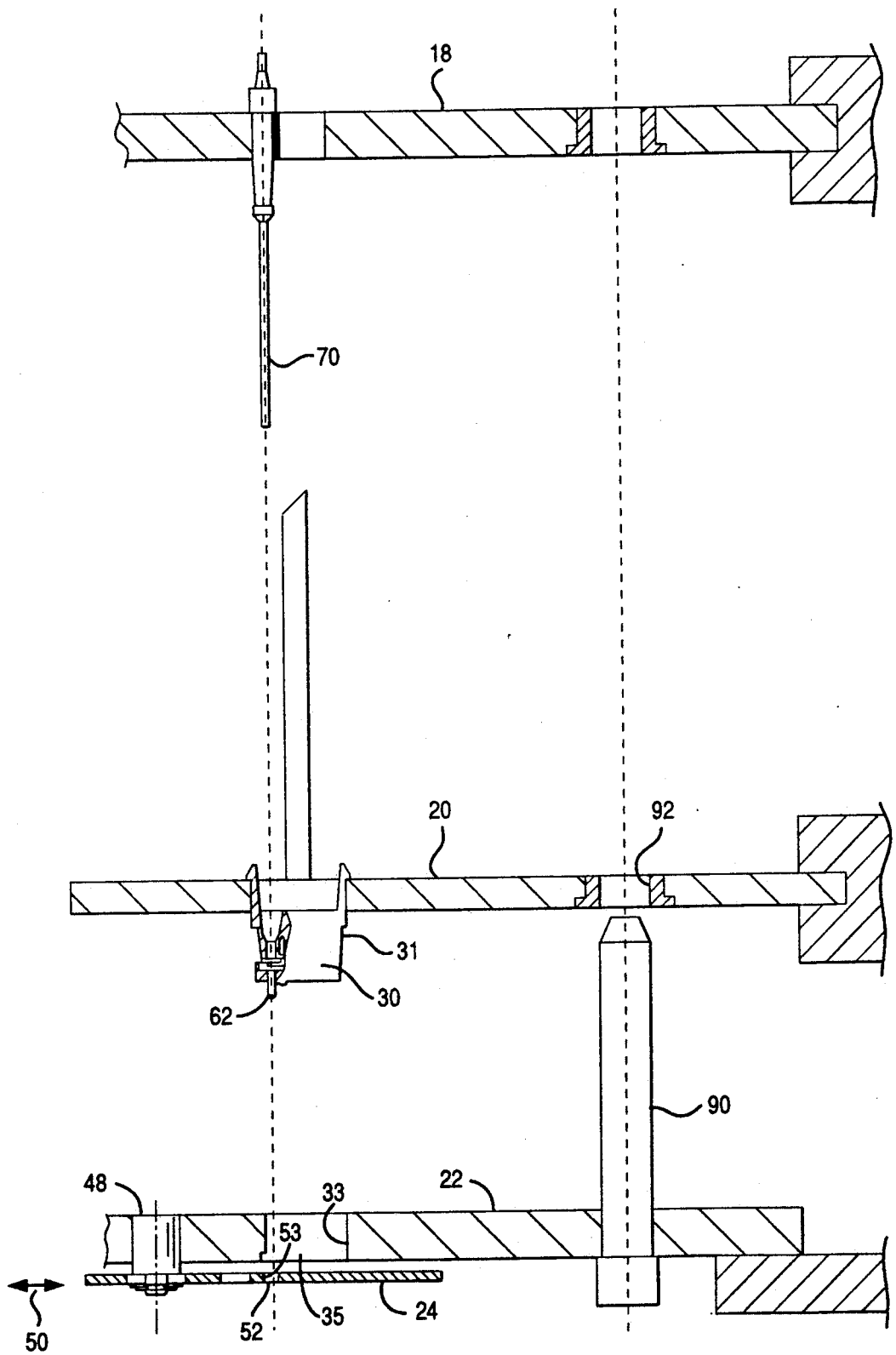
FIG. 9 is a front elevational view, partly in section, illustrating the stationary, load, and vacuum plates when extended away from one another.

Referring back to FIG. 2, the vacuum plate 18 of a given module 12 will support a plurality of downward extending vacuum tubes or needles 70 shown in FIGS. 7-9 which will upon proper relative movement of the various plates to be hereinafter described, cause the needles 70 to extend through respective ones of the funnel-shaped apertures 64 of each respective chip placement subassembly shown in FIG. 3. As also detailed further in the copending patent application Ser. No. 07/353,299, at appropriate times when a chip has been placed in registry downwards of the aperture 64 by the previously described shuttling mechanism, and due to a vacuum being drawn on the needle 70 through a corresponding tube 72. FIG. 7, the chip will be retained at this location.

Subsequent downward movement of the plate 18 and thus the needles 70 while continuing to draw the vacuum will cause the chips to be attached to the lower tips of their respective needles. Further downward movement of the plate 18 and needles will thereby cause the chips to be displaced through appropriate respective holes in the shuttle plate 24 (after it has been withdrawn to the right). Still further downward displacement of the plate 18 and needles 70 will cause the chips to engage the printed circuit board 14 at the desired ultimate sites on board 14.

The board 14 preferably will previously have had a plurality of glue dots placed on its upper surface at locations where it is desired for chips to be placed and affixed by the invention. This may be accomplished for example by employing the system shown in U.S. Pat. No. 4,946,708 entitled Pin Transfer Adhesive Application for Surface Mount Component Processes.

Figure 4:
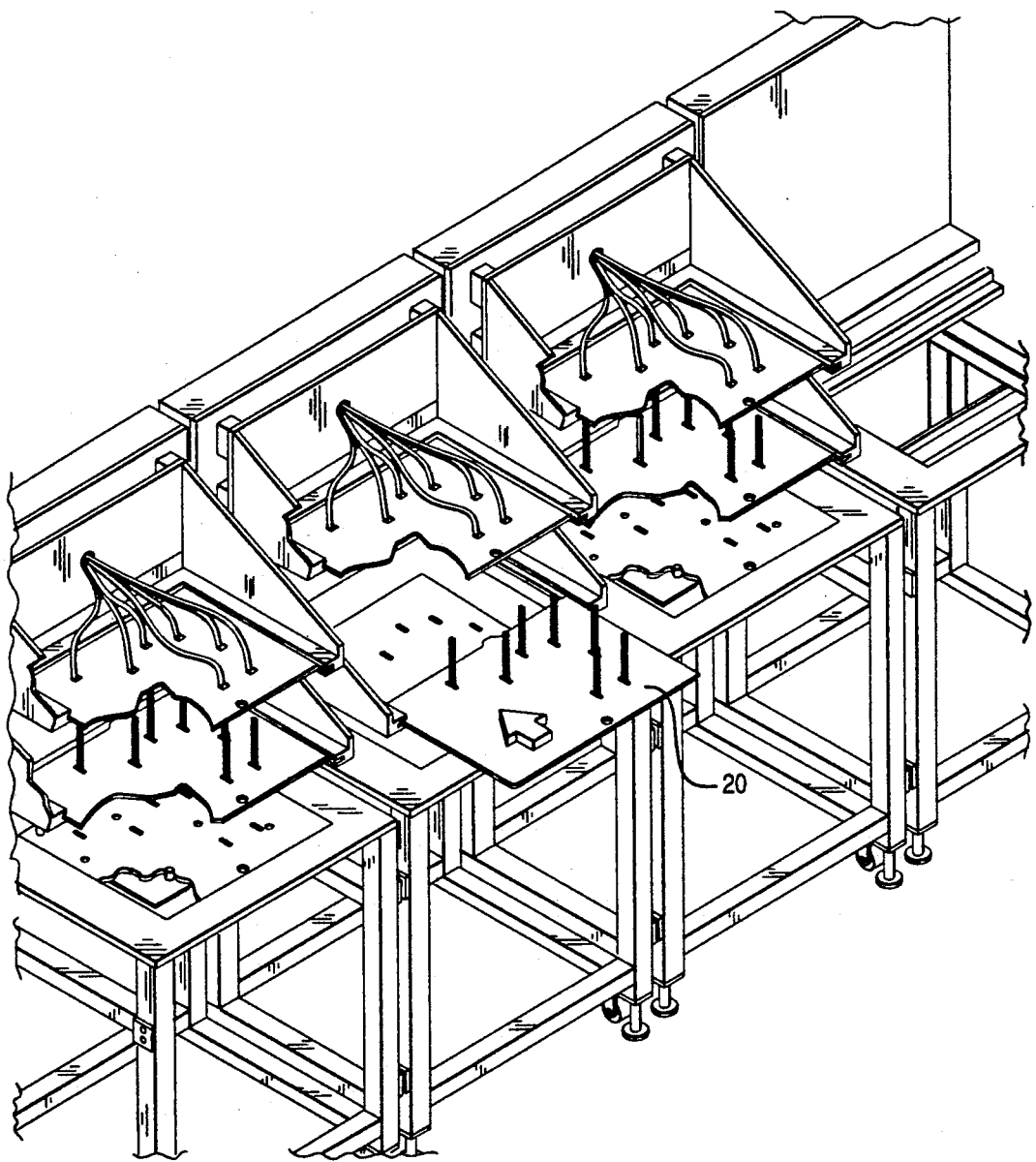
FIG. 4 is a pictorial illustration of a portion of the placement system of FIG. 1 showing the installation of a load plate.

It will be noted from FIG. 7 that the vacuum plate 18 will be provided with a plurality of such vacuum needles 70 and corresponding tubes 72 arranged in the horizontal area defined by the vacuum plate 18 in a pattern corresponding to the desired placement of the chip subassemblies in the load plate 20, with each such subassembly having a corresponding needle 70 disposed in vertical registry therewith. It will further be noted from FIG. 4 that a feature of the invention described in greater detail in the copending application is that the various plates are disposed in sliding engagement on their respective modules 12 for ease of repair and changing configuration offline, as well as for ease of replenishing the supply of chips during operation of the system. This is accomplished by replacing load plates 20 having spent tubes by merely sliding the load plate having the replenished supply of tubes into the particular module 12 as shown in FIG. 4.

The load plate carries a plurality of the chip placement subassemblies which is slid into position onto the frame over the stationary plate. The load plate is then lowered onto the stationary plate with upper extending guidepins 90, FIG. 9, carried in corners of the stationary plate 22. These guidepins are matingly received by corresponding locating holes 92 in the load plate 20 to horizontally registered the load plate 20 and thus the chip placement subassemblies carried thereon initially relative to the stationary/shuttle plates 22-24. Each placement subassembly is retained in sliding engagement in a respective slightly oversized slot in the load plate to facilitate final placement and accurate registry of the respective subassembly's block relative to the stationary plate.

More particularly, a block 30 portion of each placement assembly (FIG. 9) is tapered at edges 31 whereby further downward movement of the load plate causes the tapered surface to contact the wall 33 of a corresponding receiving aperture 35 in stationary plate 22.

The respective placement subassembly is thereby finally and accurately positioned by being displaced as required in the oversized slot in the load plate 20 for final alignment by contact with walls 30. During such downward movement of the load plate, the downwardly extending pin 62 portion of the slider of each chip placement subassembly (FIG. 3) is introduced into a corresponding aperture 52 (FIG. 9) in the shuttle plate, the aperture being tapered along walls 53 so as to receive the projection means regardless of the exact initial relative position of the shuttle plate 24 relative to the pin 62 and stationary plate 22.

It may be seen from the foregoing that numerous relative motions are involved with respect to the previously described vacuum plate 18, load plate 20, stationary plate 22, shuttle plate 24, and lift plate 26. For example, a comparison of FIGS. 7 & 8 clearly show that once a load plate 20 with a replenished supply of chips is slid into a module 12 as shown in FIG. 4 with the vacuum tube and associated needles disposed upwards to permit such inward sliding of the load plate as shown by the arrow, the vacuum plate 18 must then be moved downwards so as to permit each needle 70 to engage its respective funnel in its respective chip assembly carried on the load plate 20. This is depicted by the downward movement of the vacuum plate 18 in the direction of the arrow shown in FIG. 7 to the position relative to the load plate 20 shown in FIG. 8. The actual sequence of movement of the respective plates will now be summarized and described in greater detail with particular attention being called to novel features of these plates which facilitate the crucial and critical mutual alignments so necessary in effecting the precise placement of extremely tiny chips.

Figure 10:
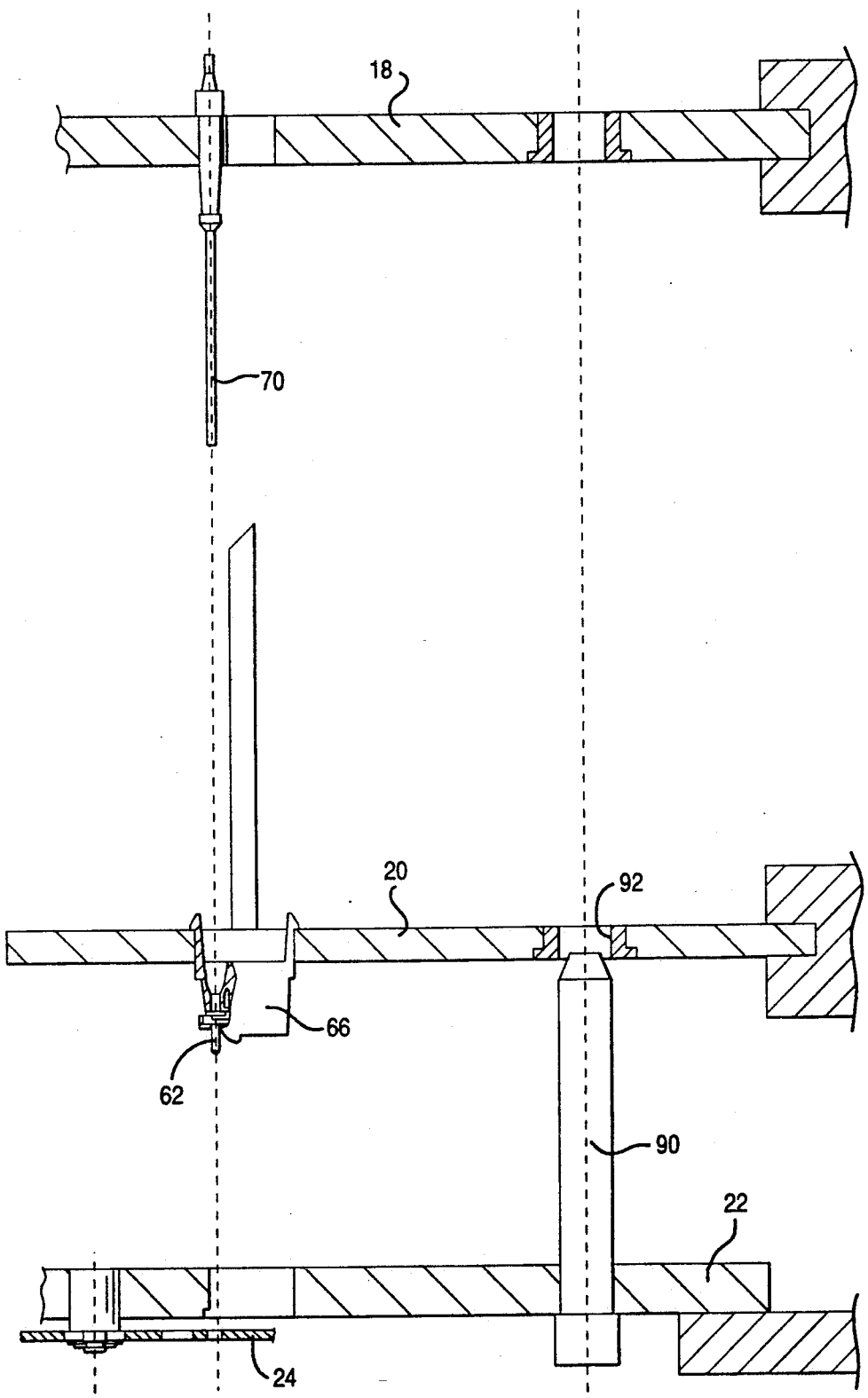
FIG. 10 is a front sectioned elevational view of the plates of FIG. 9 showing engagement between the stationary and load plates.

Load plate 20 is initially slid into the frame 16 (FIG. 4). This load plate is thence lowered to the stationary/shuttle plate 22-24 (FIG. 9-10) with guidepins 90 on stationary plate 22 initially positioning the load plate 20 relative to the stationary/shuttle plate 22-24 by mating engagement with locating holes 92 on the load plate 20.

Figure 11:
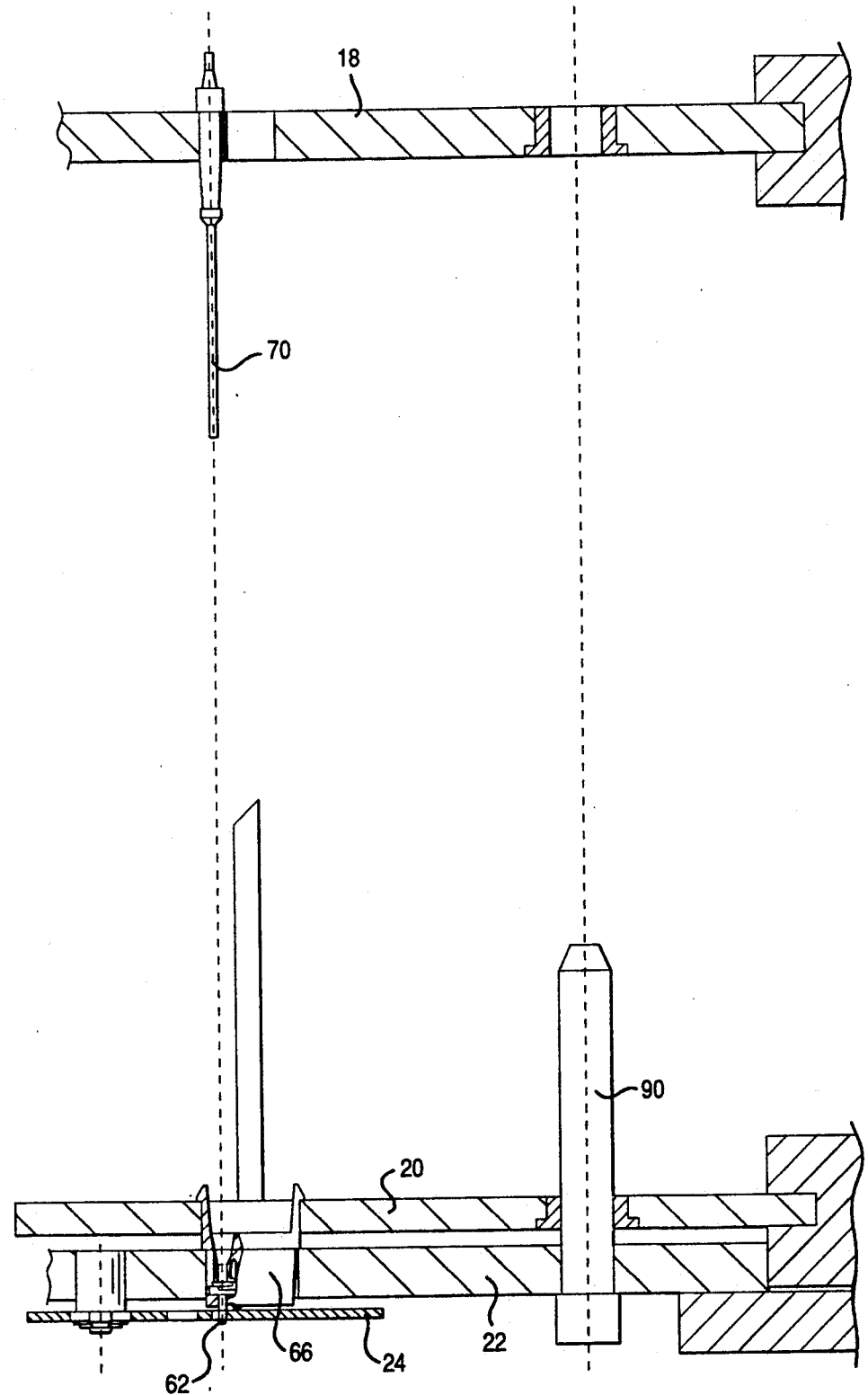
FIG. 11 is another view of the plates of FIG. 10 showing completed engagement between the stationary and load plates.

Chip placement subassemblies carried on the load plate are then finally positioned relative to the stationary/shuttle plates 22-24 by (1) engagement of tapered blocks 30 (FIG. 9-11) with walls 33 of apertures 35 and (2) engagement of pins 62 of sliders of each chip subassembly with tapered walls 53 of corresponding apertures 52 in shuttle plate 24 (FIG. 11).

Motor 30 is engaged then with solenoid 42 (FIG. 5) being activated to raise stop pin 40. Board 14 is inserted at the left of the module 12 to engage the conveyor belt 32 and then transported rightwardly until stopped by the stop pin 40. Cylinder 34 is activated then to raise the board 14 with standoffs 28 on the lift plate 26 until registration pins 44 on corners of stationary plate 22 engage registration holes 46 in the board 14, thereby accurately positioning board 14 relative to the stationary plate 22 in the horizontal plane.

Sliders 56 are urged leftward by shuttle plate 24 to strip off respective chips 54 (FIG. 3) and position them under respective funnel-shaped apertures 64. Vacuum plate 18 is then lowered (FIG. 7, 8, and 12) until needles 70 are introduced into respective apertures 64 with the aforementioned guidepins 90 on stationary plate 22 engaging guide holes 92 (FIG. 12) in vacuum plate 18 to accurately place the needles 70 in the funnel slots.

Shuttle plate 24 and thus sliders 56 are returned to the right while vacuum is drawn on the vacuum needles 70 which thus support respective chips on the tube ends.

Vacuum plate 18 is moved further downward whereupon chips carried by suction on the end of the respective needles 70 are caused to engage respective sites on the upper surface of board 14, thereby populating the board.

Vacuum plate 18 is moved upward then so that needles 70 again are positioned proximally to the funnel-shaped apertures 64 in the chip placement subassemblies (FIG. 3). Solenoid 42 has been deactivated withdrawing the stop pin 40 downward and conveyor belt 32 is then activated again to move the thus-populated board 14 to the right, whereby it exits a module 14 and is introduced into the next adjacent module for additional chip population (each such module acting in the manner previously described).

The above process is then again repeated whereby stop pin 40 is raised, a next planar board 14 is introduced into the module 12, conveyor 32 is again activated and so on.

Figure 12:
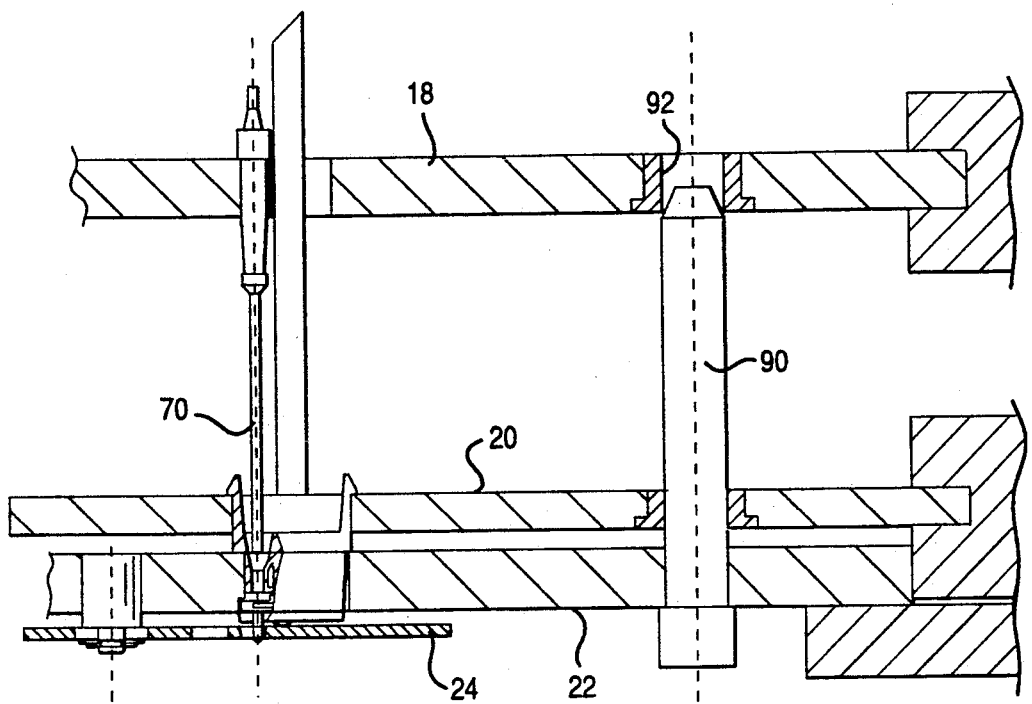
FIG. 12 is another view of the plates of FIG. 11 showing completed engagement of the stationary, load, and vacuum plates.
Figure 13:
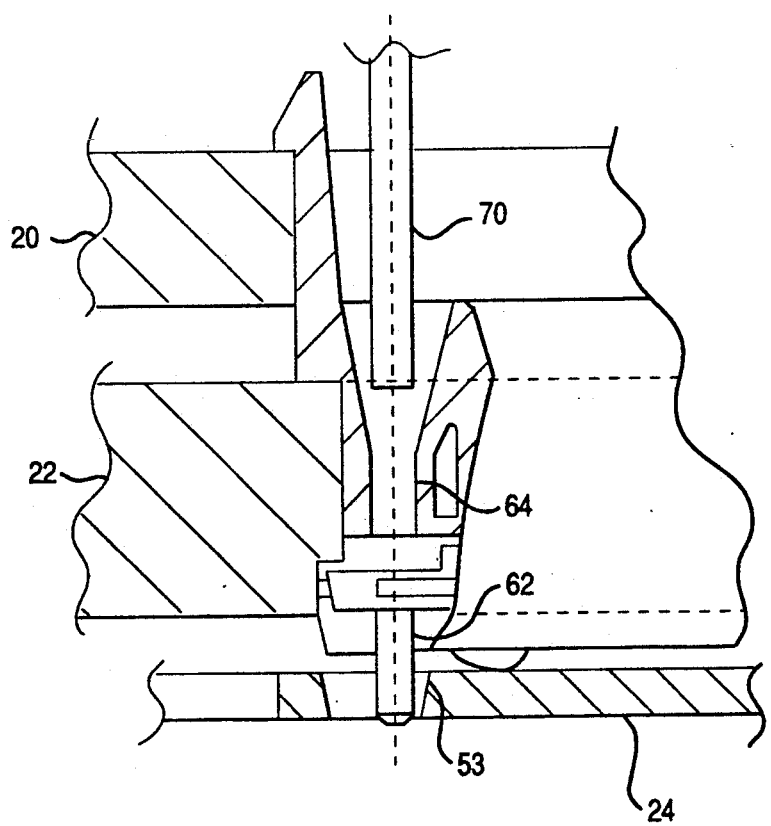
FIG. 13 is a sectioned detail of a portion of FIG. 12 illustrating the chip subassembly in greater detail.
Figure 14:
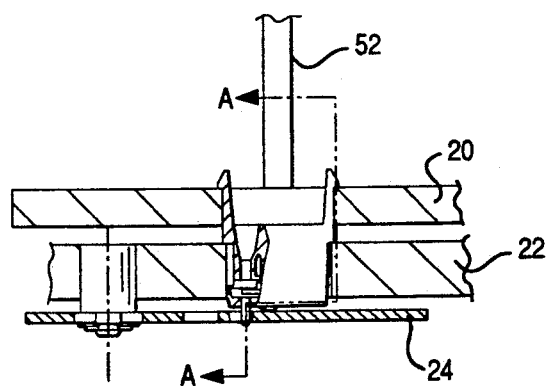
FIG. 14 is another side view, partly in section, illustrating the chip subassembly.
Figures 15, 16:
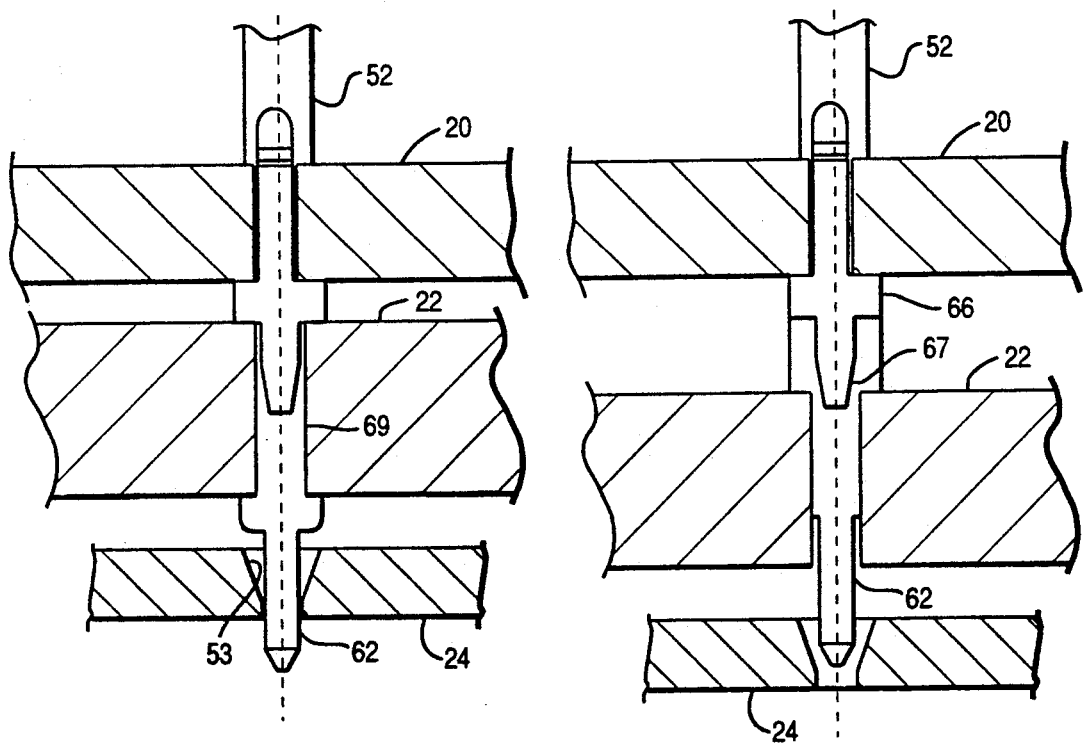
FIG. 15 is a section view of the chip subassembly of FIG. 14 taken along line A—A.
FIG. 16 is another end view of the subassembly of FIG. 14.

Referring now to FIGS. 12-18 details of the structure of some of the previously described features of the invention may be seen. FIG. 12 shows the apparatus prior to lowering of the vacuum plate 18, a detail of this Figure being seen in FIG. 13. In FIG. 13 the funnel-shape of the aperture 64 of the chip-carrying block 66 may be seen in greater detail. It will be recalled that such shape is adapted to accommodate slight misalignments in vertical registry with the vacuum needles 70 as the vacuum plate 18 is lowered so that each needle 70 may engage by suction one of its respective chips prior to placement. Also in FIG. 13, the aforementioned tapered wall 53 of the shuttle 24 may be seen, the purpose of which is also to accommodate slight misalignments in vertical registry between the pin 62 of the slider and the shuttle 24 during the installation process of the chip subassemblies into the stationary plate 22 and shuttle plate 24. This feature may also be better seen with reference to FIGS. 14-16 wherein the pin 62 is shown prior to and after insertion in the shuttle plate 24 in FIGS. 16 and 15 respectively, which are detailed sections of a portion of FIG. 14 which shows the load, stationary, and shuttle plates 20-24. Specifically, the block 66 is shown to have sidewall tapers 67 to align the block 66 in the aperture 69 of the stationary plate 22.

Figure 17:
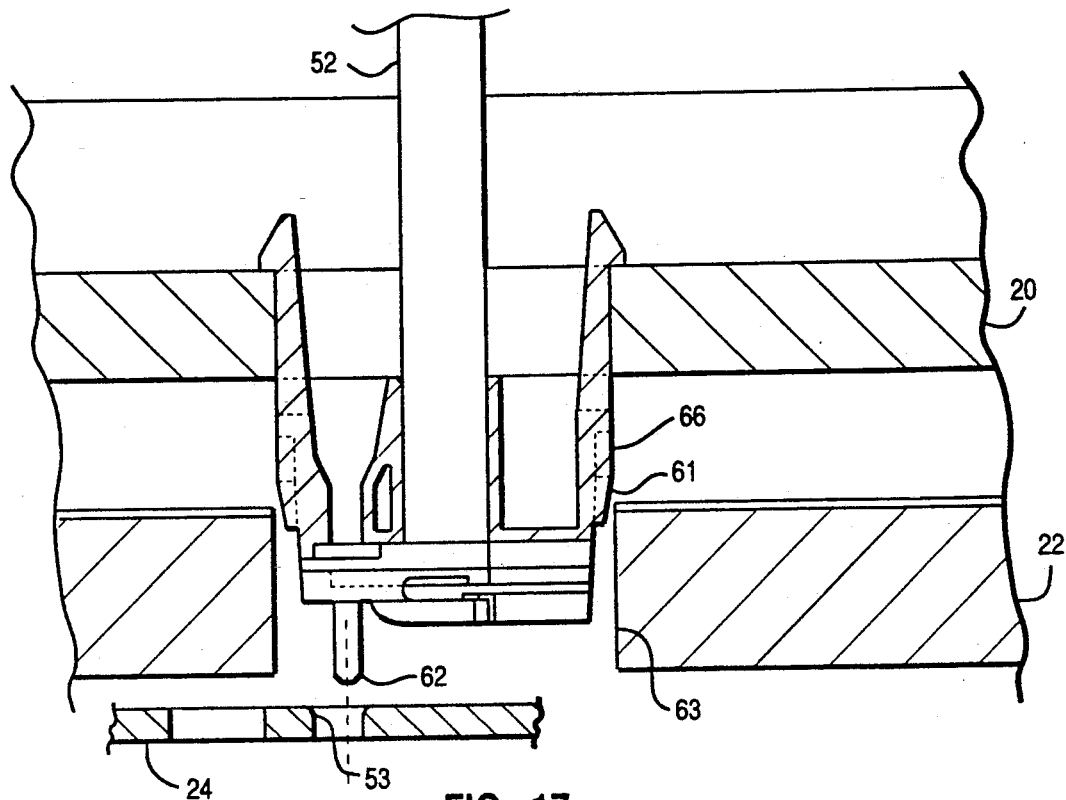
FIG. 17 is yet another side view of the chip subassembly prior to engagement with the shuttle plate.
Figure 18:
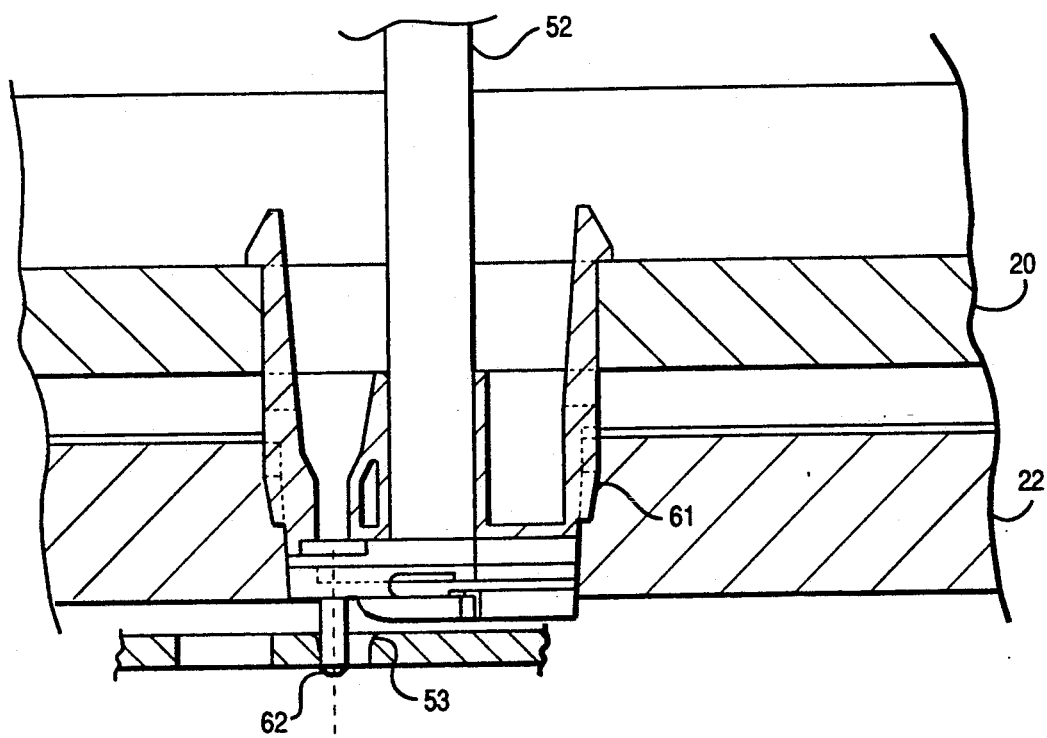
FIG. 18 is another view of the chip subassembly of FIG. 17 after engagement with the shuttle plate.

In similar matter, with reference to FIGS. 17 and 18. FIG. 17 shows the block 66 prior to the pin 62 being inserted into the shuttle plate 24, and FIG. 18 shows the assembly after insertion. Again, tapered block surfaces 61 may be seen on the block 66 for finally aligning the block 66 within the stationary plate 22. Similarly, the tapered wall surfaces 53 of the apertures in the shuttle plate 24 are seen which are provided for accommodating slight vertical misalignments in registry between the pin 62 and the shuttle plate 24, both the tapered block edges 61 and tapers in the pin 62 and wall surfaces 53 being the mechanisms which provide the final precise alignment of the block 66 in the shuttle plate assembly.

While the invention has been shown and described with reference to particular embodiments thereof, it will be understood by those skilled in the art that the foregoing and other changes in form and detail may be made therein without departing from the spirit and scope of the invention.

We claim:

1. A method for populating a circuit board planar with a plurality of chips comprising a) establishing a first plurality of stacks of said chips b) conveying said planar to a location beneath said first plurality of stacks c) simultaneously depositing a chip from each of said first plurality of stacks onto said planar wherein said deposited chips form a preselected geometric pattern d) establishing a second plurality of stacks of said chips adjacent said first plurality of stacks e) conveying said planar outwards from under said first plurality of stacks to a second location beneath said second plurality of stacks, and f) simultaneously next disposing a chip from each of said second plurality of stacks onto said planar wherein said next deposited chips form a second preselected geometric pattern on said planar.

2. The method of claim 1 wherein said step of simultaneously depositing said chip from said first plurality of stacks comprises stripping a chip laterally from each of said first plurality of stacks;

supporting each of said stripped chips by vacuum;

simultaneously moving said vacuum-supported chips toward said planar until said chips contact said planar; and releasing said vacuum.

3. The method of claim 2 wherein said first pluralities of stacks are carried on a respective first load plate and wherein said method further includes periodically withdrawing said load plate when said chips in at least one of said first plurality of stacks are substantially depleted; and replacing said first load plate with a second load plate carrying a next first plurality of stacks of chips disposed on said next load plate in said first geometric pattern.

4. The method of claim 3 wherein said vacuum is provided on a vacuum plate;

a shuttle assembly means is provided for stripping chips from said first plurality of stacks:

said conveying step comprises conveying said planar onto a lift plate, and wherein said method further comprises urging said lift plate, said vacuum plate, and said load plate towards said shuttle assembly means to establish vertical registry between said planar and said stripped chips.

5. The method of claim 4 further including disposing a plurality of chip placement subassemblies in slideable engagement on said load plate; and finally locating said chip placement subassemblies in said geometric pattern during said urging of said load plate toward said shuttle assembly means, wherein said chip placement subassemblies are moved to said final locations in a horizontal plane defined by said shuttle assembly means upon contact between said chip placement subassemblies and said shuttle assembly means.

6. A chip placement module for populating a circuit board planar with a plurality of chips, comprising a frame;

conveyor means carried by said frame for transporting said planar through said module; and a plurality of chip placement subassembly means carried by said frame for simultaneously placing a respective plurality of said chips in a preselected geometric pattern on said planar, each of said placement subassembly means being carried on a load plate, said load plate being in slidably removable engagement with said frame.

7. The apparatus of claim 6 wherein each said module further includes a vacuum plate means carried by said frame above said placement subassembly means for simultaneously periodically supporting said respective plurality of chips pneumatically.

8. The apparatus of claim 7 wherein said chips are disposed in a plurality of tubes releasably interconnected to and carried by said load plate so as to form vertical stacks of said chips disposed horizontally about said load plate.

9. The apparatus of claim 8 wherein each said module further includes a shuttle plate assembly means carried by said frame and disposed below said vacuum plate means for simultaneously stripping a plurality of single chips each from a respective one of said stacks for subsequent support by said vacuum plate means.

10. The apparatus of claim 9 wherein said module further includes lift plate means disposed below said shuttle plate assembly means for supporting and urging said planar from said conveyor means and into contact with said shuttle plate assembly means.

11. The apparatus of claim 10 wherein said shuttle plate assembly means includes guide pin means extending upwards for contacting and establishing registry between said shuttle plate assembly means, said load plate, and said vacuum plate means; and registration pin means extending upwards for contacting and establishing registry between said shuttle plate assembly means and said planar during said contact.

12. The apparatus of claim 11 wherein each of said plurality of chip placement subassembly means includes a block slidably engaging said load plate and having tapered edges; and wherein said stationary plate includes a plurality of apertures each for matingly receiving a respective one of said blocks, said tapered edges of each of said blocks slidably engaging respective walls of a respective one of said apertures to urge said block horizontally into a predetermined location relative to said stationary plate.

13. Apparatus for populating a circuit board planar with a plurality of chips, comprising a plurality of chip placement modules each module having a frame;

conveyor means carried by said frame for receiving said planar from an adjacent one of said modules and transporting said planar through said module to a next adjacent one of said modules; an a plurality of chip placement subassembly means carried by said frame for simultaneously placing a respective plurality of said chips in a preselected geometric pattern on said planar.

14. The apparatus of claim 13 wherein each of said placement subassembly means is carried on a load plate.

15. The apparatus of claim 14 wherein said load plate is in slidably removable engagement with said module.

16. The apparatus of claim 15 wherein each said module further includes a vacuum plate means for simultaneously periodically supporting said respective plurality of chips pneumatically; and means for periodically urging said vacuum plate means and said planar when supported at rest on said conveyor means towards and away from one another.

17. The apparatus of claim 16 wherein said chips are disposed in a plurality of stacks on said load plate.

18. The apparatus of claim 17 wherein each said module further includes a shuttle plate assembly means for simultaneously stripping a plurality of single chips each from a respective one of said stacks for subsequent support by said vacuum plate means.

19. The apparatus of claim 18 wherein said plurality of modules are aligned side-by-side whereby respective said conveyor means define a transverse line along which said planar is transported laterally through each said module.

20. The apparatus of claim 19 wherein each of said modules further includes lift plate means for urging said planar from said conveyor means and into contact with said shuttle plate assembly means.

21. The apparatus of claim 20 wherein said shuttle plate assembly means includes guide pin means for establishing registry between said shuttle plate assembly means, said load plate, and said vacuum plate means; and registration pin means for establishing registry between said shuttle plate assembly means and said planar.

22. The apparatus of claim 21 wherein each of said plurality of chip placement subassembly means includes a block slidably engaging said load plate and having tapered edges: and wherein said stationary plate includes a plurality of apertures each for matingly receiving a respective one of said blocks.

said tapered edges of each of said blocks slidably engaging respective walls of a respective one of said apertures to urge said block horizontally into a predetermined location relative to said stationary plate.

* * * * *